United States Patent [19]

Lippitt et al.

[11] Patent Number: 5,504,686
[45] Date of Patent: Apr. 2, 1996

[54] MISSION PLANNING COSTING SURFACE

[75] Inventors: Carl E. Lippitt, Albuquerque, N.M.;
David N. Price, Melbourne, Fla.

[73] Assignee: Honeywell Inc., Minneapolis, Minn.

[21] Appl. No.: 159,651

[22] Filed: Nov. 30, 1993

[51] Int. Cl.$^6$ .................. G06F 19/00; G05D 1/06; G01C 21/00
[52] U.S. Cl. .................. 364/444; 364/433; 364/456; 342/65; 395/129
[58] Field of Search .................. 364/444, 449, 364/456, 457, 458, 460, 423, 433; 342/63, 64, 65, 142, 197, 458; 340/990, 995; 395/121, 126, 127, 129

[56] References Cited

U.S. PATENT DOCUMENTS

| | | | |
|---|---|---|---|
| 4,144,571 | 3/1979 | Webber | 364/450 |
| 4,685,068 | 8/1987 | Greco, II et al. | 364/518 |
| 4,760,396 | 7/1988 | Barney et al. | 342/65 |
| 4,823,271 | 4/1989 | Clark et al. | 364/443 |
| 4,954,837 | 9/1990 | Baird et al. | 342/458 |
| 5,067,098 | 11/1991 | Moellering et al. | 395/126 |
| 5,086,396 | 2/1992 | Waruszewski, Jr. | 364/454 |
| 5,140,532 | 8/1992 | Beckwith, Jr. et al. | 340/971 |
| 5,355,442 | 10/1994 | Paglieroni et al. | 395/127 |

OTHER PUBLICATIONS

Asseo, "Terrain Following/Terrain Avoidance Path Optimization Using the Method of Steepest Descent", IEEE 1988, pp. 1128–1136.
Avila et al., "An Overview of a Global Positioning System Mission Planner Implemented on a Personal Computer", IEEE 1990, pp. 10–18.
Bate et al., "Heuristic Route Planning: An Application to Fighter Aircraft", IEEE 1988, pp. 1114–1120.
Burge et al., "A Technique for Measuring Optical Line of Sight", Systems Development Department, pp. 3–6.
Holmes, "Visual Reply to Map–Related Queries—A Free Space Graph Approach", IEEE 1989, pp. 92–98.
Pekelsma et al., "Interactive, Operational Tactical Mission Planning" National Technical Meeting, pp. 143–146 (1988).
Thompson et al., "Digital Terrain Analysis Station (DTAS)", Dept. of Army Unclassified, pp. 1∝10.
Zyl et al., "The Effect of Topograph on SAR Calibration", IEEE 1993, pp. 1036–1043.
"A Technique for Measuring Optical Line of Sight" by Burge et al., Naval Weapons Center, TP 5916, pp. 3–6 (Jan. 1977).
"Demonstration of an Innovative Technique for Terrain Following/Terrain Avoidance—The Dynapatch Algorithm—" by Denton et al., IEEE, pp. 522–529 (1985).
"Interactive, Operational Tactical Mission Planning" by Pekelsma et al., National Technical Meeting, Santa Barbara, CA, Jan. 26–29, 1988, Proceedings (A88-51701 22–04), Washington, D.C., Institute of Navigation, pp. 143–146 (1988).
"Digital Terrain Analysis Station (DTAS)" by Thompson et al., Dept. of Army Unclassified Report No. ETL–R040 (Aug. 28, 1982).

*Primary Examiner*—Kevin J. Teska
*Assistant Examiner*—Tan Nguyen
*Attorney, Agent, or Firm*—Ronald E. Champion; Kenneth J. Johnson

[57] ABSTRACT

A mission planning costing surface is formed from digital terrain elevation data of a given geographical region and is for use in routing covert flight paths. To form the costing surface, a hideability map is generated from the digital terrain elevation data by assigning line of sight area values to points within the digital terrain elevation data. The hideability map is indicative of hideable areas within the geographical region. The hideability map is then quantized by assigning each of the line of sight area values to one of a set number of quantization levels. A flyability map is formed from the digital terrain elevation data by determining slopeness values for points within the digital terrain elevation data. The flyability map is indicative of flyable areas of the geographical region. The flyability map is quantized by assigning each of the slopeness values to one of the quantization levels. The costing surface is formed from a weighted combination of the quantized hideability map and the quantized flyability map.

10 Claims, 7 Drawing Sheets

FIG. 3
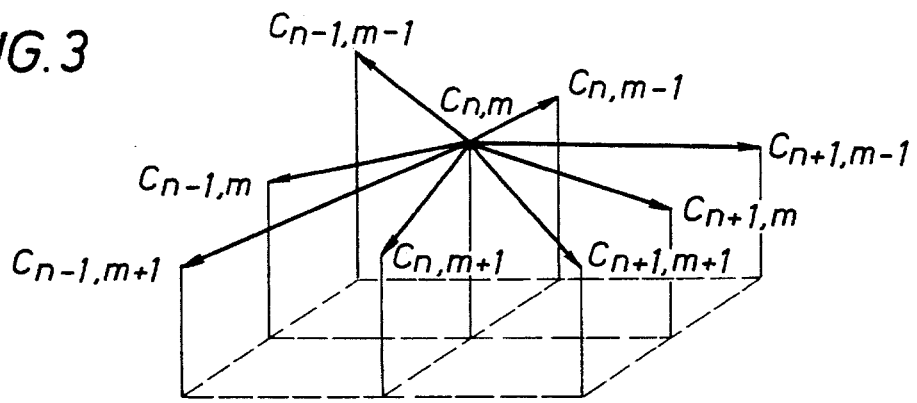
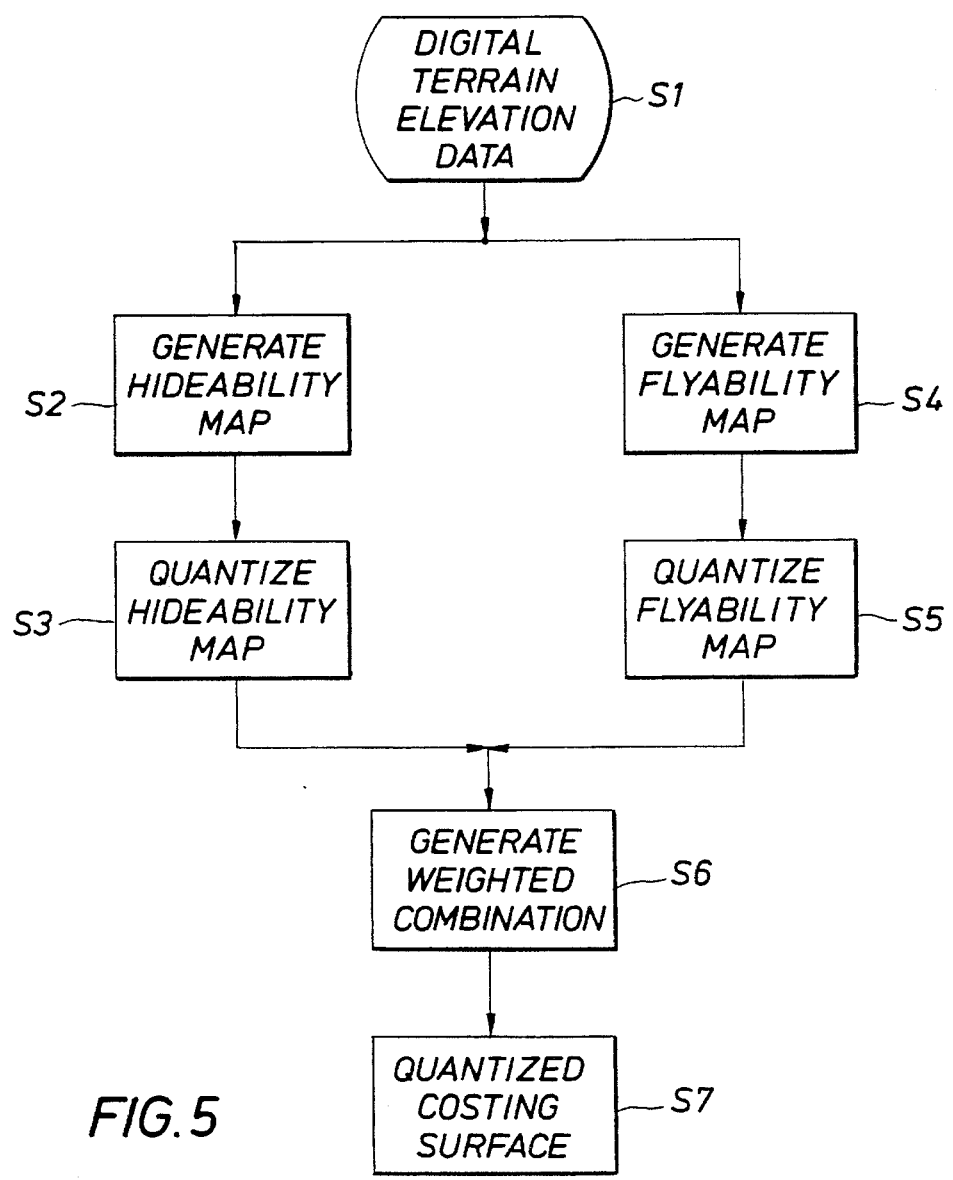
FIG. 5

DIGITAL TERRAIN ELEVATION DATA

MISSION PLANNING COSTING SURFACE

GOVERNMENT RIGHTS

The Government has rights in this invention pursuant to Contract No. F33600-88-G-5107, awarded by the Department of the Air Force.

BACKGROUND OF THE INVENTION

The invention relates to routing of covert flight paths for maximum terrain masking. More particularly, the invention relates to use of digital terrain elevation data to generate a costing surface which allows superior routing of covert flight paths.

Digital terrain elevation data (DTED) is a digital representation of the topography of a geographical region. DTED is produced from satellite photographs or other means and is available through the Defense Mapping Agency to government contractors on a need-to-know basis. DTED comprises a plurality of digital data points laid out in a grid with a spacing typically on the order of 800 meters between points.

When routing flight paths for covert operations, it is desirable to route the paths such that maximum terrain masking is achieved. Particularly, it is desirable to avoid highly visible areas such as ridge tops and wide open areas.

According to the prior art, it is known to route covert flight paths using DTED such that the flight path is always in the lowest local area. This routing method rests on the assumption that the best terrain masking will always be at the lowest local elevation. However, this assumption is not always true, and thus the prior art method frequently results in less than optimum routing of flight paths. For example, consider an airplane flying perpendicular to the plane of the paper along a line through point A in FIG. 1. Because of the high valley created by parallel ridges R1 and R2, the flight path through point A will have excellent terrain masking. Under the prior art assumption that the lowest local elevation has the best terrain masking, however, the prior art routing method will cause the airplane to move from position A to the lower position B in the adjacent valley. Clearly, despite the fact that position B is lower than position A, the terrain masking in the open valley is significantly inferior to the terrain masking at position A. Moreover, in order to move from position A to position B, the flight path must move over ridge R1, i.e., through a highly visible area where detection is likely. Thus, the prior art routing method cannot be used to provide reliable terrain-masked covert flight paths.

The use of local minimums in DTED to route covert flight paths also neglects the importance of the roughness or "flyability" of the terrain. Where the surface of the local minimum is very rough, it will be difficult for the aircraft to maintain a low altitude flight path. Flying at an increased altitude over low but rough terrain may in many cases be more visible than flying at a lower altitude over flatter, higher terrain. Known methods of routing covert flight paths do not satisfactorily address this issue.

SUMMARY OF THE INVENTION

The invention overcomes the above-described disadvantages of the prior art by providing a costing surface which allows superior routing of covert flight paths. In some embodiments, the invention relates to a method of routing covert flight paths using digital terrain elevation data of a geographical region, comprising the steps of forming a hideability map from the digital terrain elevation data, the hideability map being indicative of hideable areas within the geographical region; forming a flyability map from the digital terrain elevation data, the flyability map being indicative of flyable areas of the geographical region; creating a costing surface from a weighted combination of the hideability map and the flyability map; and routing a covert flight path through areas of the costing surface which are both hideable and flyable.

In some aspects, the hideability map is formed from the digital terrain elevation data using a line of sight area calculation, and the flyability map is formed from the digital terrain elevation data using a slopeness calculation.

In other aspects, the invention further includes the steps of quantizing the hideability map and quantizing the flyability map prior to forming the costing surface. The step of quantizing the hideability map may in some embodiments include the steps of normalizing points within the hideability map based on a maximum theoretical value and distributing the normalized points into a plurality of quantized levels.

In some embodiments, the weighted combination is performed in accordance with the following formula where $Pq$ is a point within the costing surface, $Hq$ is a quantized hideability value, $Fq$ is a quantized flyability value, and "a" and "b" represent weighting factors between 0 and 255:

$$Pq = \frac{127}{15} \sqrt{\frac{((a)^2 Hq^2 + (b)^2 Fq^2)}{(a^2 + b^2)}}$$

In some aspects, the line of sight area calculation includes the steps of performing a ray trace from one point in the digital terrain elevation data to every other point within a circle of radius "R" centered on the one point; and determining how many of the points within the circle are observable from the one point based on the ray trace.

In some embodiments, the invention relates to a method of forming a costing surface from digital terrain elevation data of a geographical region for use in routing covert flight paths, comprising the steps of forming a hideability map from the digital terrain elevation data by assigning line of sight area values to points within the digital terrain elevation data, the hideability map being indicative of hideable areas within the geographical region; quantizing the hideability map by assigning each of the line of sight area values to one of a set number of quantization levels; forming a flyability map from the digital terrain elevation data by determining slopeness values for points within the digital terrain elevation data, the flyability map being indicative of flyable areas of the geographical region; quantizing the flyability map by assigning each of the slopeness values to one of a plurality of quantization levels; and creating a costing surface from a weighted combination of the quantized hideability map and the quantized flyability map.

BRIEF DESCRIPTION OF THE DRAWINGS

FIG. 3 is a diagram illustrating a "slopeness" calculation according to an embodiment of the invention;

FIG. 5 is a flow chart according to a preferred embodiment of the invention;

DESCRIPTION OF THE PREFERRED EMBODIMENT

A preferred embodiment of the invention will now be described with reference to the accompanying drawings.

According to the invention, a costing surface is generated from the DTED. The costing surface indicates what it "costs" from an observability standpoint to get from a point A to a point B on the surface along a given route. As explained in detail below, the costing surface is formed from a hideability map and a flyability map, each of which is generated individually from the DTED.

Figure 1:
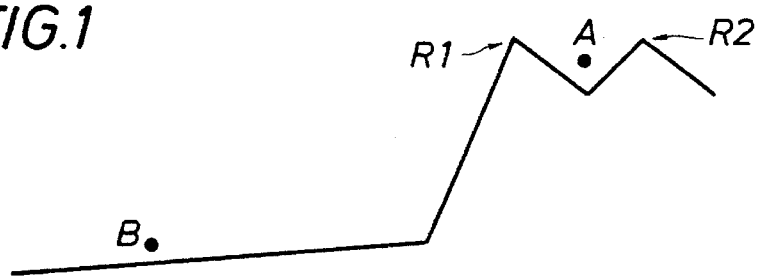
FIG. 1 is a diagram illustrating prior art covert flight path routing systems.
Figure 2A:
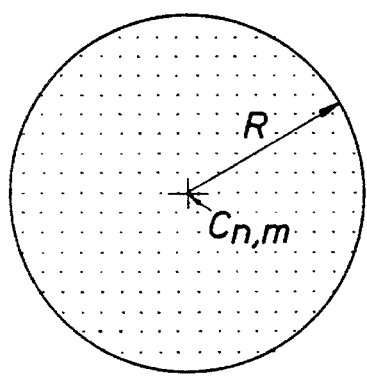
FIG. 2a is a schematic diagram illustrating a line of sight area calculation according to an embodiment of the invention.
Figure 2B:
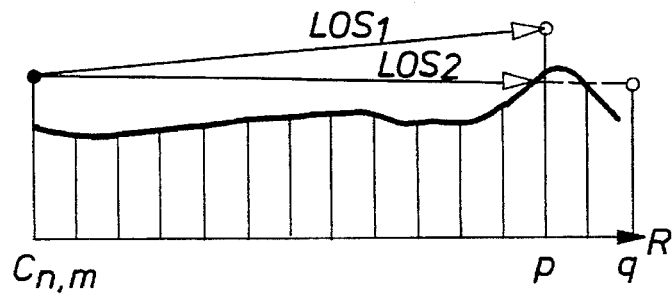
FIG. 2b is a cross-sectional diagram illustrating a line of sight calculation according to an embodiment of the invention.
Figure 2C:
FIG. 2c is a schematic diagram illustrating a set point clearance used according to an embodiment of the invention.
Figure 2D:
FIG. 2d is a schematic diagram illustrating a distant point clearance used according to an embodiment of the invention.

The hideability map is indicative of which areas on a given DTED plot are most "hideable", i.e., have the best terrain masking. To generate this map, a "hideability transformation" is performed on the DTED. In the hideability transformation, a line of sight area (LOSA) calculation is made for each DTED point within the plot. Referring to FIG. 2a, for a given point $C_{n,m}$ within the plot, a circle of radius R is drawn around the point so as to encompass a certain number of other data points. A line of sight determination is then made from the point $C_{n,m}$ (called the "set point") to each of the other points in the circle (the "distant points") to determine whether there is a direct line of sight between the two points. Preferably, the set point is biased by a set point clearance (usually on the order of 500 feet) above the local terrain elevation as shown in FIG. 2c. Similarly, the distant points are biased by a distant point clearance (usually on the order of 50 feet) above the distant terrain elevation, as shown in FIG. 2d.

With the set and distant point clearances established, it is determined whether the biased distant point is obstructed by any other terrain point between it and the biased set point. If not, that distant point is said to be observable. For example, referring to FIG. 2b, the set point is illustrated as being 500 feet above the terrain at point $C_{n,m}$. Distant point p, which is fifty feet above the terrain, is observable from set point $C_{n,m}$ as shown by ray $LOS_1$. However, distant point q is not observable from point $C_{n,m}$ because the ray $LOS_2$ intersects with the terrain at point p.

Once the line of sight determination has been conducted with respect to set point $C_{n,m}$ for every point within the circle of radius R, point $C_{n,m}$ is assigned a scalar value indicative of the number of observable points within the area of the circle. This completes the line of sight area ("LOSA") calculation for that point. The LOSA calculation is then repeated for every point $C_{n,m}$ within the plot.

The scalar value assigned to each point $C_{n,m}$ as a result of the LOSA calculation has a defined minimum value of 9 (i.e., the center point itself plus the eight immediately surrounding points are assumed to be observable) and a maximum value defined by $\pi R^2$ divided by the point spacing (typically 800 meters). R is preferably on the order of thirty miles.

The flyability map is indicative of the roughness of the terrain within a given DTED plot. To generate this map, a "flyability transformation" is performed on the DTED. The flyability transformation involves determining a "slopeness" value for each point $C_{n,m}$ within the DTED plot. To obtain the slopeness value, a value indicative of slope is calculated from point $C_{n,m}$ to each of its eight neighboring points ($C_{n-1, m-1}$ to $C_{n+1, m+1}$) as shown in FIG. 3. The slopeness value is defined as the summation of these eight values. The slopeness value is not actually a slope, since it has not been divided by the point spacing, but it is indicative of the roughness of the terrain at point $C_{n,m}$. This process is then repeated for each point $C_{n,m}$ within the plot. A high slopeness value is indicative of rough terrain, while a low slopeness value indicates that the terrain is relatively flat.

Once the hideability and flyability maps have been obtained, it is necessary to quantize the scalar values assigned to the points in each map for storage purposes. Preferably, each map is quantized to sixteen levels, thus requiring only four bits to store the value at each point.

The quantization of the flyability transformation is straight-forward, and preferably is conducted according to the following table:

| Quantized Value | Slopeness Threshold |
| --- | --- |
| 0 | <1000 |
| 1 | <1100 |
| 2 | <1200 |
| 3 | <1300 |
| 4 | <1400 |
| 5 | <1500 |
| 6 | <1600 |
| 7 | <1700 |
| 8 | <1800 |
| 9 | <2000 |
| 10 | <2200 |
| 11 | <2400 |
| 12 | <2800 |
| 13 | <2900 |
| 14 | <3000 |
| 15 | >=3000 |

The non-linear nature of this quantization table allows more important slopeness ranges to be emphasized in the quantized result and less important ranges to be de-emphasized.

The hideability map is also preferably quantized into sixteen levels. To perform this quantization, the LOSA values are first normalized based on the maximum theoretical value, i.e., $\pi R^2$ divided by the point spacing. Then, thresholds are determined which equalize the normal distribution into 16 levels.

Figure 4A:
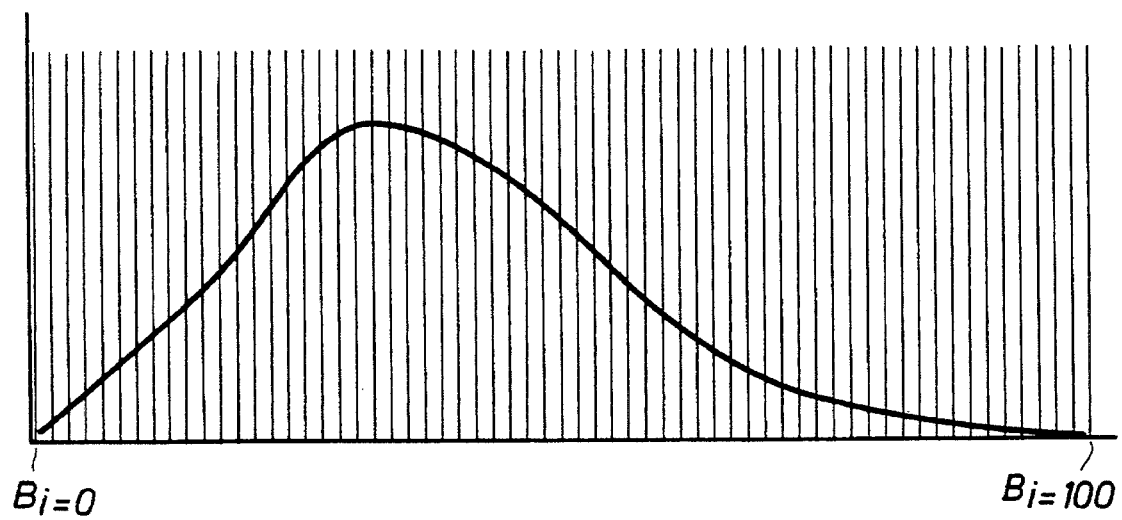
FIG. 4A is a graph showing division of a hideability distribution into bins according to an embodiment of the invention.
Figure 4B:
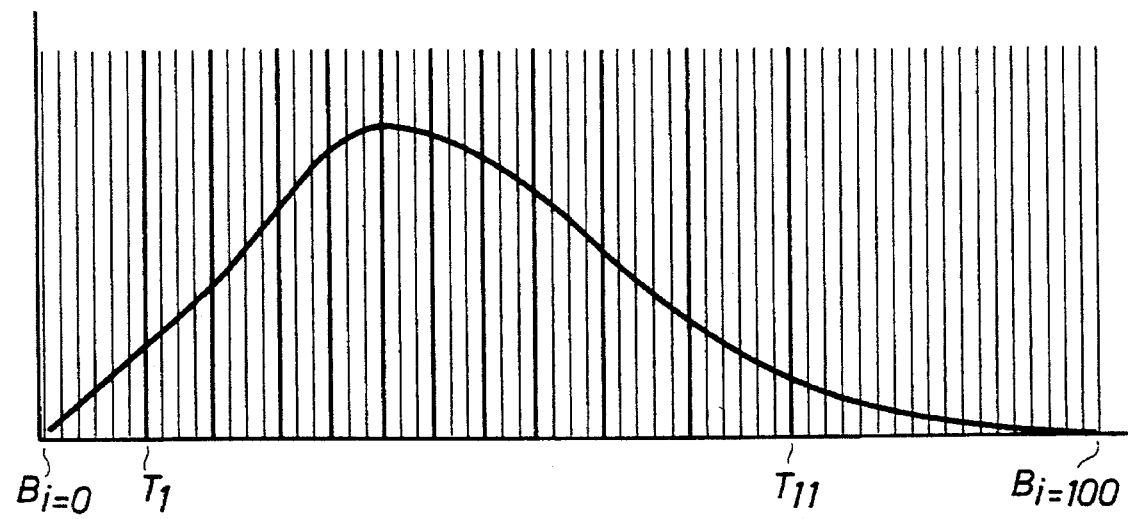
FIG. 4B is a graph showing assignment of weighted thresholds according to an embodiment of the invention.

For example, a preferred method for quantizing the hideability map is as follows. First, the distribution of LOSA values is normalized according to the maximum theoretical value, which is approximated as $4\pi R^2$. The "4" (or $2^2$) in this equation is derived from the fact that for an 800 meter point separation there are approximately two DTED points per nautical mile. Then, the normalized distribution is divided into 100 bins $B_i$ as shown in FIG. 4A. These bins are then assigned to quantization levels by determining weighted thresholds $T_n$ as shown in FIG. 4B. The weighted thresholds are determined by counting the number of normalized points beginning with bin $B_1$ until 4096 points have been counted. These points then fall into the first of the 16 quantization levels, and the counting re-starts with the next bin. This process ends when all sixteen levels have been assigned or the bins are exhausted. As shown in FIG. 4B, if the bins are exhausted before all 16 levels are assigned, several of the levels may not be used (only 12 levels are assigned in this example). The result is quantization of the hideability map in a way which emphasizes those bins which occur under the "hump" of the distribution.

Following quantization of the hideability and flyability maps, the costing surface is obtained from a weighted combination of the quantized maps. Particularly, if Hq represents a quantized hideability value, Fq represents a quantized flyability value, Pq represents the quantized result, i.e., a point in the costing surface, and "a" and "b" are weighting factors which may range between 0 and 255, then:

$$Pq = \frac{127}{15} \sqrt{\frac{((a)^2 Hq^2 + (b)^2 Fq^2)}{(a^2 + b^2)}}$$

The value of "a" and "b" may vary depending upon the application, but are typically chosen to be on the order of a=60, b=100.

The method of generating a costing surface discussed above is illustrated in the flow chart of FIG. 4. In this chart, the process begins in state S1 with a DTED plot of a given geographical area. Then, in step S2 line of sight area calculations are performed to generate a hideability map. In step S3, the hideability map is quantized to facilitate storage. At the same time, in step S4 a flyability map is generated from the DTED, which is then quantized in step S5. A weighted combination of the quantized maps is generated in step S6, resulting in formation of the costing surface in step S7.

Figure 6:
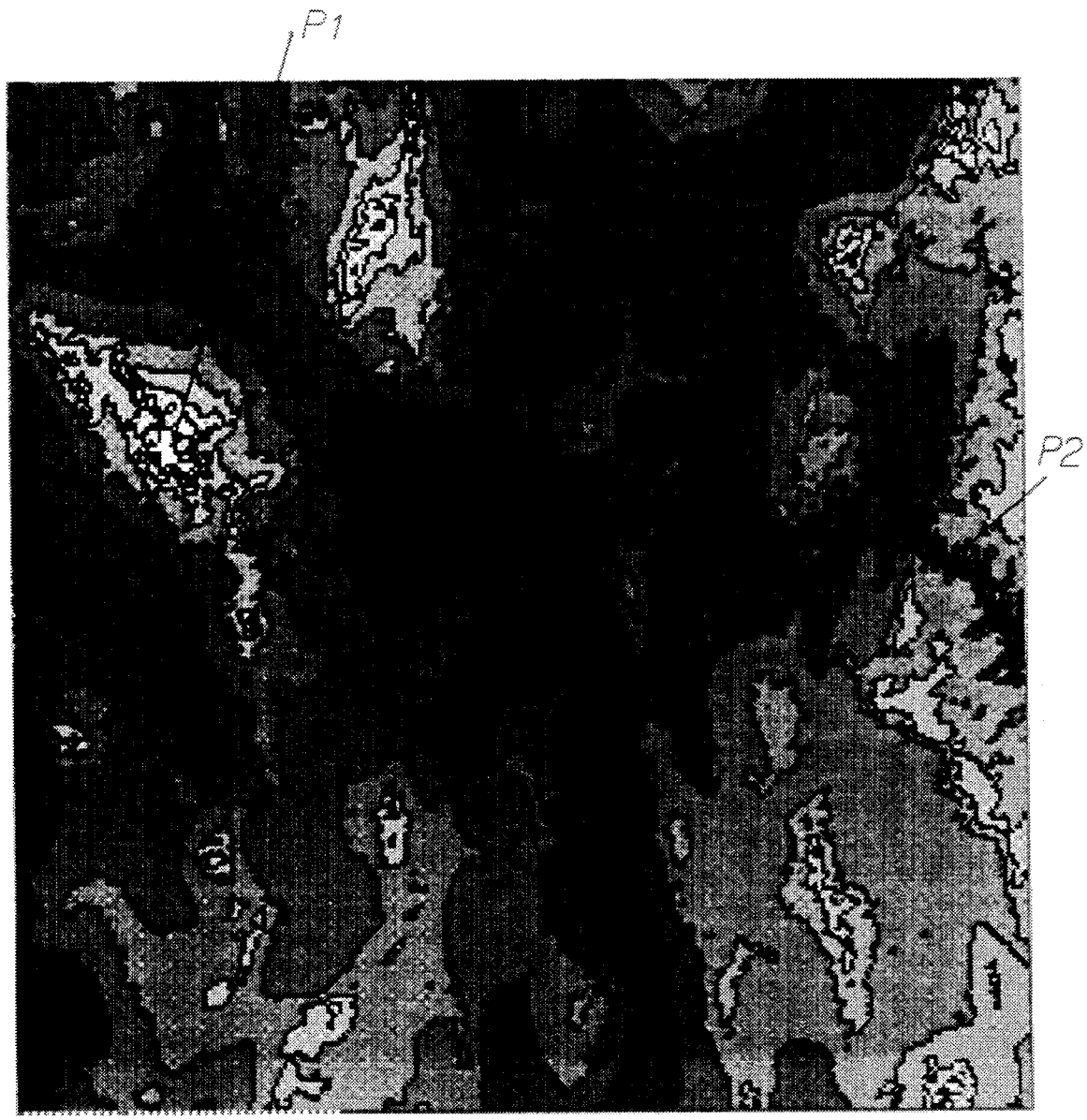
FIG. 6 is an exemplary plot of DTED data.

A preferred embodiment of the invention is illustrated by the specific examples shown in FIGS. 5–8. FIG. 6 is a 100×100 Km DTED plot of the Las Vegas area of Nevada. The dark areas represent areas of lowest elevation, while the light areas represent the higher elevations. Thus, white areas such as that indicated as P1 represent mountain or ridge tops, while black areas such as that indicated as P2 correspond to a local minimums in elevation. In this case, local minimum P2 is a portion of the Grand Canyon.

Figure 7:
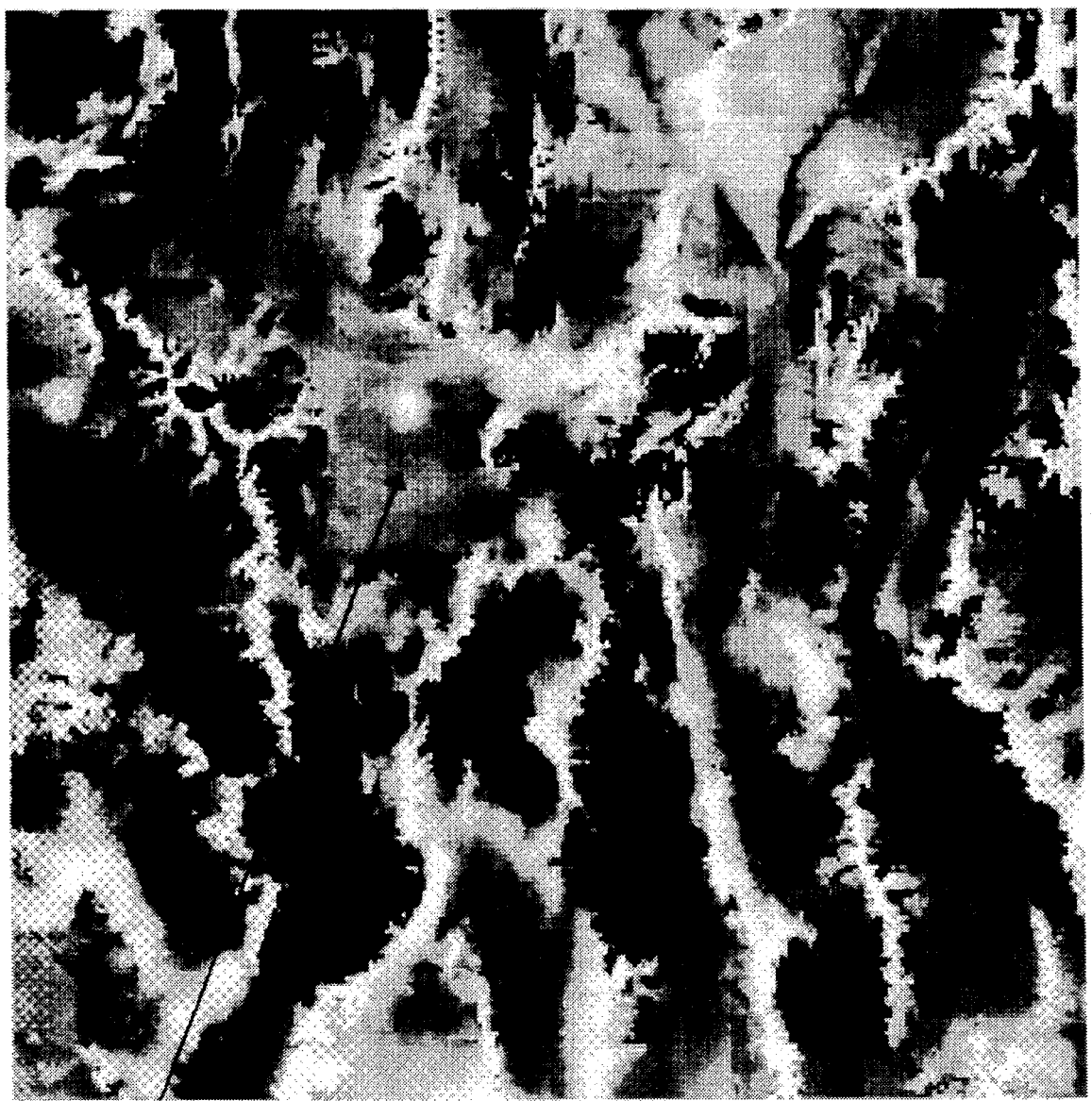
FIG. 7 is a hideability map formed from the DTED of FIG. 6.

FIG. 7 shows the hideability map formed from the DTED in FIG. 6. Light areas represent areas of least hideability, while dark areas indicate areas which are more hideable, i.e., have greater terrain masking. As illustrated for example by point P3, a point which is in a local terrain minimum according to the DTED may in fact be highly observable. The white portions of the hideability transformation correspond mostly to wide open valleys and ridge tops.

Figure 8:
FIG. 8 is a flyability map formed from the DTED of FIG. 6.

FIG. 8 shows a flyability map formed from the DTED of FIG. 6. In this figure, dark areas represent areas which are relatively flat or "flyable", while light areas represent areas where the terrain is rough. For example, point P4 shown in FIG. 7 illustrates that the terrain in the vicinity of the Grand Canyon is quite rough as would be expected.

Figure 9:
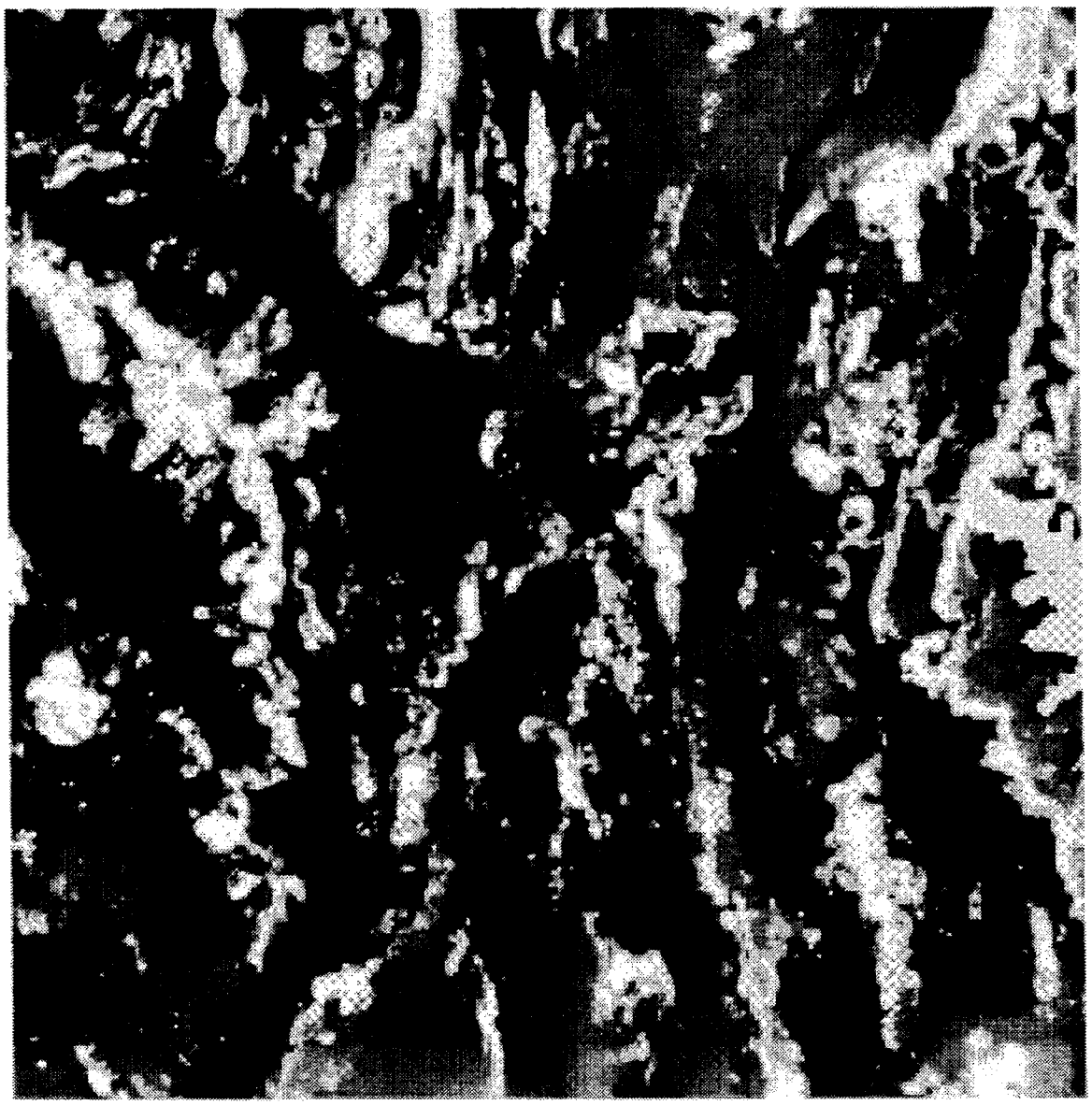
FIG. 9 is a costing surface obtained from a weighted combination of the hideability map of FIG. 7 and the flyability map of FIG. 8.

The costing surface which results from the weighted combination of the hideability and the flyability maps is shown in FIG. 9. Here, the value of weighting factors "a" and "b" were chosen to be a=63, b=100. On this costing surface, the darkest areas of the surface indicate those areas which are both hideable and flyable. Thus, the costing surface may be used to effectively route covert flight paths for maximum terrain masking.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

The embodiments of the invention in which an exclusive property or right is claimed are defined as follows:

1. A method of routing covert flight paths using digital terrain elevation data of a geographical region, comprising the steps of:

forming a hideability map from the digital terrain elevation data, said hideability map being indicative of hideable areas within the geographical region;

forming a flyability map from the digital terrain elevation data, said flyability map being indicative of flyable areas of the geographical region;

creating a costing surface from a weighted combination of said hideability map and said flyability map, where the weighted combination is based on predetermined weighting factors applied to hideability and flyability; and routing a covert flight path through areas of said costing surface which are both hideable and flyable.

2. A method as claimed in claim 1, wherein said hideability map is generated by using a line of sight area calculation on terrain points in the digital terrain elevation data.

3. A method as claimed in claim 1, wherein said flyability map is generated by determining a slopeness value for each point in the digital terrain elevation data in relation to a plurality of surrounding terrain points.

4. A method as claimed in claim 2, wherein said flyability map is generated by performing a slopeness calculation on each point in the digital terrain elevation data in relation to a plurality of surrounding terrain points.

5. A method as claimed in claim 1, further comprising the steps of quantizing the hideability map and quantizing the flyability map prior to forming the costing surface.

6. A method as claimed in claim 5, wherein the step of quantizing the hideability map includes the steps of normalizing points within the hideability map based on a predetermined maximum value and distributing the normalized points into a plurality of quantized levels.

7. A method as claimed in claim 5, wherein the weighted combination is performed in accordance with the following formula where Pq is a point within the costing surface, Hq is a quantized hideability value, Fq is a quantized flyability value, and "a" and "b" represent weighting factors between 0 and 255:

$$Pq = \frac{127}{15} \sqrt{\frac{((a)^2 Hq^2 + (b)^2 Fq^2)}{(a^2 + b^2)}}$$

8. A method as claimed in claim 2, wherein said line of sight area calculation includes the steps of:

performing a ray trace from one point in the digital terrain elevation data to every other point within a circle of a predetermined radius centered on said one point; and determining which points within the circle are observable from said one point based on the ray trace.

9. A method of forming a costing surface from digital terrain elevation data of a geographical region for use in routing covert flight paths, comprising the steps of:

forming a hideability map from the digital terrain elevation data by assigning line of sight area values to points within the digital terrain elevation data, said hideability map being indicative of hideable areas within the geographical region;

quantizing said hideability map by assigning each of said line of sight area values to one of a plurality of quantization levels;

forming a flyability map from the digital terrain elevation data by determining slopeness values for points within the digital terrain elevation data, said flyability map being indicative of flyable areas of the geographical region;

quantizing said flyability map by assigning each of said slopeness values to one of a plurality of quantization levels; and creating a costing surface from a weighted combination of said quantized hideability map and said quantized flyability map, where the weighted combination is based on predetermined weighting factors applied to hideability and flyability.

10. A method as claimed in claim 9, wherein the weighted combination is performed in accordance with the following formula where Pq is a point within the costing surface, Hq is a quantized hideability value, Fq is a quantized flyability value, and "a" and "b" represent weighting factors between 0 and 255:

$$Pq = \frac{127}{15} \sqrt{\frac{((a)^2 Hq^2 + (b)^2 Fq^2)}{(a^2 + b^2)}}$$

\* \* \* \* \*